United States Patent [19]

Schoettl

[11] Patent Number: 5,386,337
[45] Date of Patent: Jan. 31, 1995

[54] VALVE CONTROL UNIT AND METHOD FOR ITS PRODUCTION

[75] Inventor: Johannes Schoettl, Obertraubling, Germany

[73] Assignee: Siemens Aktiengesellschaft, Munich, Germany

[21] Appl. No.: 127,233

[22] Filed: Sep. 27, 1993

[30] Foreign Application Priority Data

Sep. 25, 1992 [DE] Germany ............... 4232205

[51] Int. Cl.6 ............................... H02B 1/26
[52] U.S. Cl. ...................... 361/622; 361/796; 361/807; 174/52.2
[58] Field of Search ............... 361/600, 601, 622, 627, 361/730, 752, 765, 796, 812, 807; 174/52.2, 255, 258, 260

[56] References Cited

U.S. PATENT DOCUMENTS 4,382,241 5/1983 Hehl .................... 335/153

FOREIGN PATENT DOCUMENTS 0499670 8/1992 European Pat. Off. .
3800288 6/1989 Germany .

Primary Examiner—Leo P. Picard
Assistant Examiner—Young Whang
Attorney, Agent, or Firm—Herbert L. Lerner; Laurence A. Greenberg

[57] ABSTRACT

A unit for controlling valves being actuated by electromagnets for a pressure fluid includes a housing having a housing frame and a lid defining an interior. At least one valve coil and components of the at least one valve coil, such as a wound coil body and a yoke ring, are disposed in the housing. The at least one valve coil is spaced from the housing frame defining interstices therebetween, and the components are mutually spaced apart defining interstices therebetween. A circuit carrier is disposed in the interior of the housing and is electrically connected to each valve coil. The same resilient potting composition fills up the interstices between the components and between each valve coil and the housing frame, without any boundary layers. A method for producing such a unit includes resiliently embedding the components and the at least one valve coil in the housing frame in one operation with the resilient potting composition.

8 Claims, 4 Drawing Sheets

VALVE CONTROL UNIT AND METHOD FOR ITS PRODUCTION

BACKGROUND OF THE INVENTION
FIELD OF THE INVENTION

The invention relates to a unit for controlling valves (a valve control unit) that are actuated by electromagnets, for a pressure fluid, including a housing having a housing frame and a lid, at least one valve coil disposed in the housing along with its components, such as a wound coil body and a yoke ring, and a circuit carrier being disposed in the interior of the housing and being electrically connected to each valve coil.

Such a valve control unit is an electronic control unit for an anti-lock brake system (ABS) in a motor vehicle, for instance, in which brake fluid actuating wheel brakes is controlled with two valves per wheel. The valves are each actuated by one electromagnet.

The invention also relates to a method for producing such a valve control unit.

An ABS system known from Published European Application No. 0 499 670 A1 has a housing with a housing frame and a lid. Valve coils are resiliently embedded in the housing frame. That is achieved by positioning the valve coils in their location with respect to the housing frame and filling interstices with a potting composition.

The components of the valve coil, such as the wound coil body and the yoke ring surrounding it, are filled with a potting composition before being installed in the housing frame. Next, the valve coils are installed in the housing and fixed by potting. Accordingly, in the valve control unit, two operations that are done separately from one another are needed in order to pot all of the parts. Problematic boundary layers or joint areas are created between the two potting compositions.

SUMMARY OF THE INVENTION

It is accordingly an object of the invention to provide a valve control unit and a method for its production, which overcome the hereinafore-mentioned disadvantages of the heretofore-known devices and methods of this general type and which create a valve control unit that is capable of compensating for production tolerances in a valve block and therefore makes easy installation possible.

With the foregoing and other objects in view there is provided, in accordance with the invention, a unit for controlling valves being actuated by electromagnets for a pressure fluid, comprising a housing having a housing frame and a lid defining an interior; at least one valve coil and components of the at least one valve coil, such as a wound coil body and a yoke ring, being disposed in the housing, the at least one valve coil being spaced from the housing frame defining interstices therebetween, and the components being mutually spaced apart defining interstices therebetween; a circuit carrier being disposed in the interior of the housing and being electrically connected to each valve coil; and the same resilient potting composition filling up the interstices between the components and between each valve coil and the housing frame, while being free of boundary layers.

In accordance with another feature of the invention, the potting composition fixes the at least one valve coil and the components in place relative to the housing frame.

With the objects of the invention in view, there is also provided a method for producing a unit for controlling valves being actuated by electromagnets for a pressure fluid including a housing having a housing frame and a lid defining an interior; at least one valve coil and components of the at least one valve coil, such as a wound coil body and a yoke ring, being disposed in the housing, the at least one valve coil being spaced from the housing frame defining interstices therebetween, and the components being mutually spaced apart defining interstices therebetween; and a circuit carrier being disposed in the interior of the housing and being electrically connected to each valve coil, which comprises resiliently embedding the components and the at least one valve coil in the housing frame in one operation with the same resilient potting composition filling up the interstices between the components and between each valve coil and the housing frame, while being free of boundary layers.

In accordance with a concomitant mode of the invention, there is provided a method which comprises fixing the at least one valve coil and the components in place relative to the housing frame with the potting composition.

The resilient embedding of the components of the valve coils and the valve coils themselves in the housing frame has the advantage of not producing nay voids or joint areas in the elastic composition, and at the same time the electronic components of the valve control unit are sealed off from the environment.

Other features which are considered as characteristic for the invention are set forth in the appended claims.

Although the invention is illustrated and described herein as embodied in a valve control unit and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
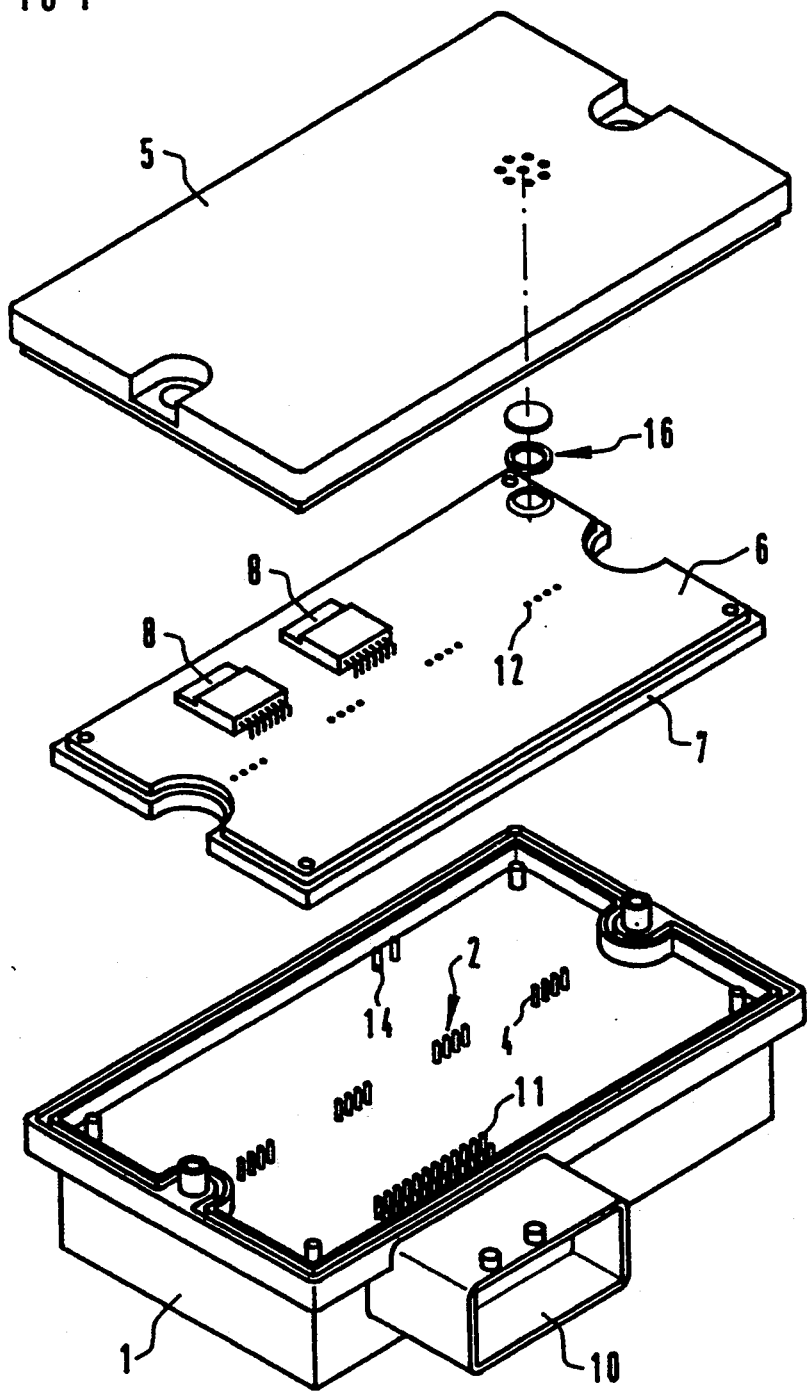
FIG. 1 is a diagrammatic, exploded, perspective view of a valve control unit according to the invention.

Referring now to the Figures of the drawing in detail and first, particularly, to FIG. 1 thereof, there is seen a housing of a valve control unit, for example for an ABS, that has a housing frame 1 in which eight valve coils 2 are disposed. The valve coils 2 are resiliently embedded with a potting composition 3 seen in FIG. 4. All that can be seen of the valve coils 2 in FIG. 1 is connection wires 4 thereof.

In the installed state of the valve control unit, a lid 5 is seated on the housing frame 1 and seals off the housing 1, 5 from the environment. A circuit carrier 6 which is secured to an aluminum base plate 7, for instance by gluing, is disposed in the interior of the housing 1, 5. The circuit carrier 6 has an ABS control circuit, which is only represented diagrammatically in this case by power components 8, since the circuit itself is not part of the invention. Many versions of suitable ABS control circuits are known.

A plug element 10 in the form of a multipoint plug is produced in one piece with the housing frame 1. Prongs 11 of the plug element 10 protrude from the potting composition 3 and exactly like the connection wires 4 of the valve coils 2, they are electrically connected to the circuit carrier 6 upon installation of the valve control unit by inserting the plug prongs 11 and the connection wires 4 through bores 12 in the circuit carrier 6 and soldering them.

Figure 3:
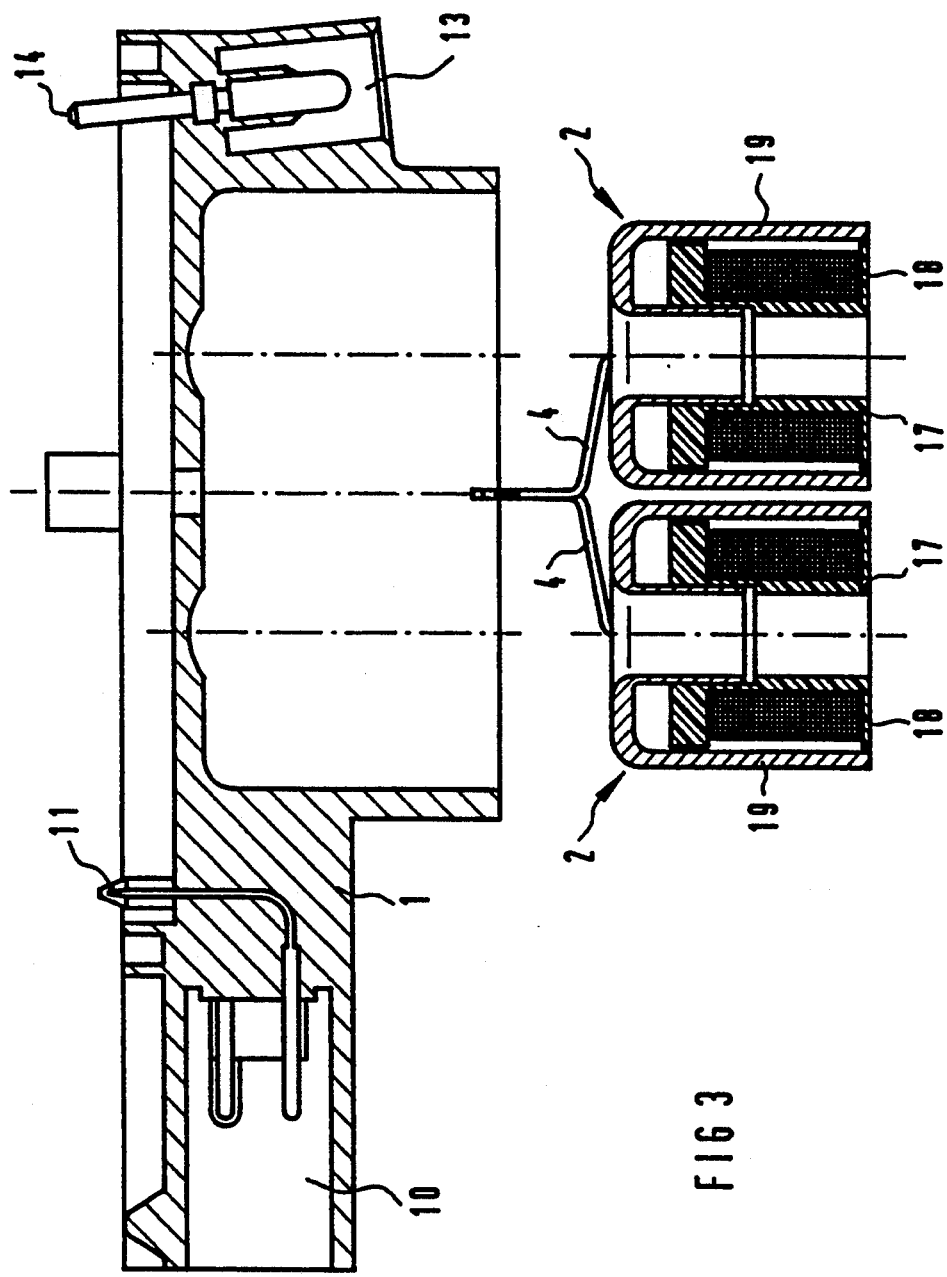
FIG. 3 is an exploded, longitudinal-sectional view of the valve control unit before installation.
Figure 4:
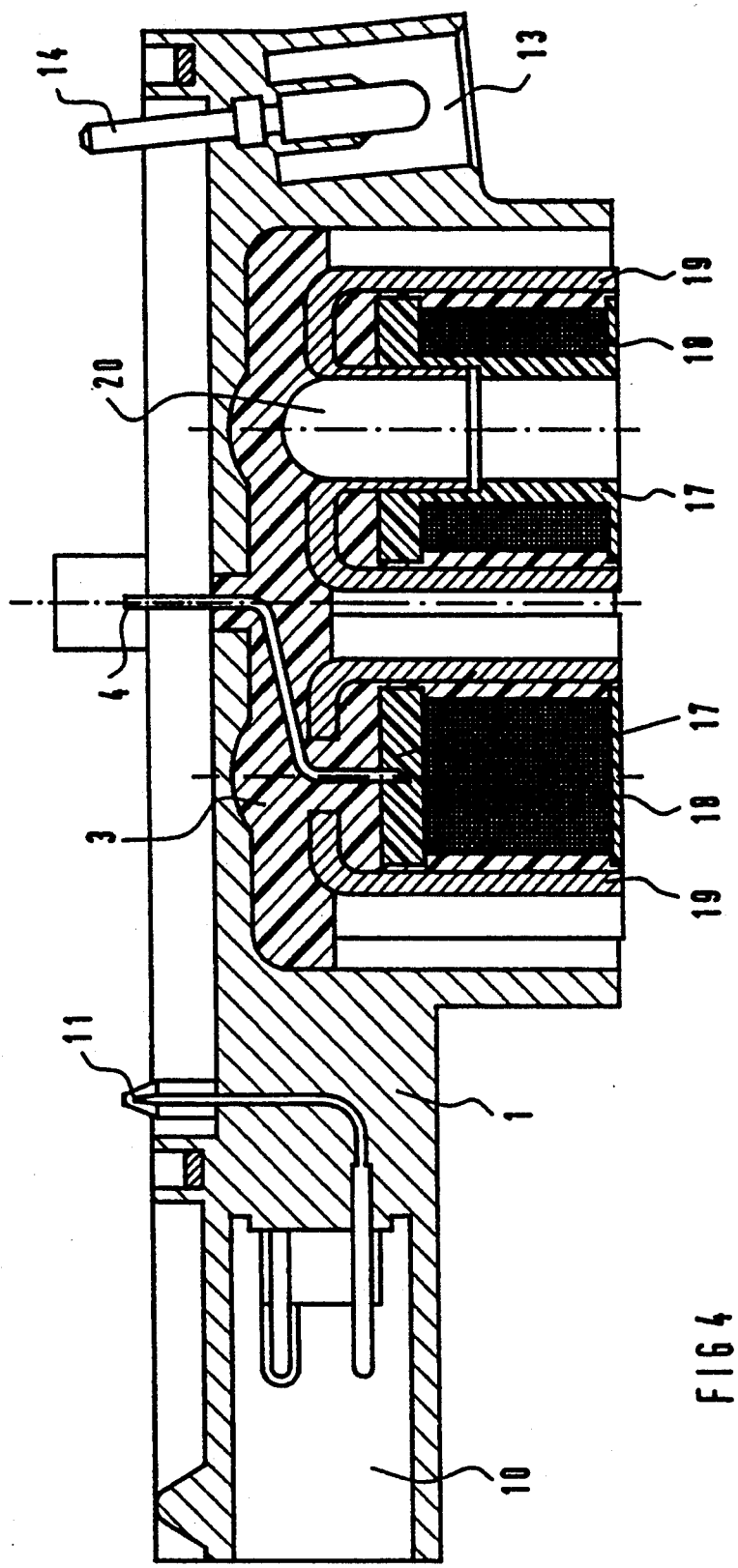
FIG. 4 is a longitudinal-sectional view of the valve control unit after installation.

A further plug element 13 which is seen in FIGS. 3 and 4 and of which only two prongs 14 can be seen in FIG. 1, serves to electrically connect the valve control unit to a non-illustrated pump motor for hydraulic fluid (brake fluid).

The housing frame 1 may have a pressure equalization element 16, which includes a diaphragm disk, a sealing ring, and a wraparound ring. The pressure equalization element 16 is inserted into a bore of the housing frame 1 and allows moisture in the air trapped in the housing 1, 5 to escape, and at the same time has a pressure-equalizing effect between the enclosure volume and the environment.

Figure 2:
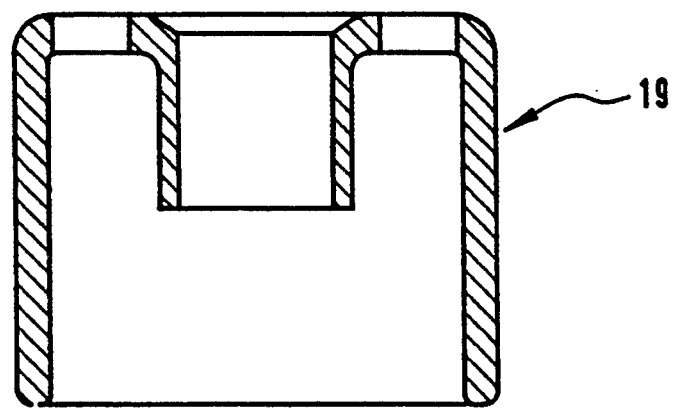
FIG. 2 is an enlarged, exploded, longitudinal-sectional view of components of a valve coil.
Figure 2:
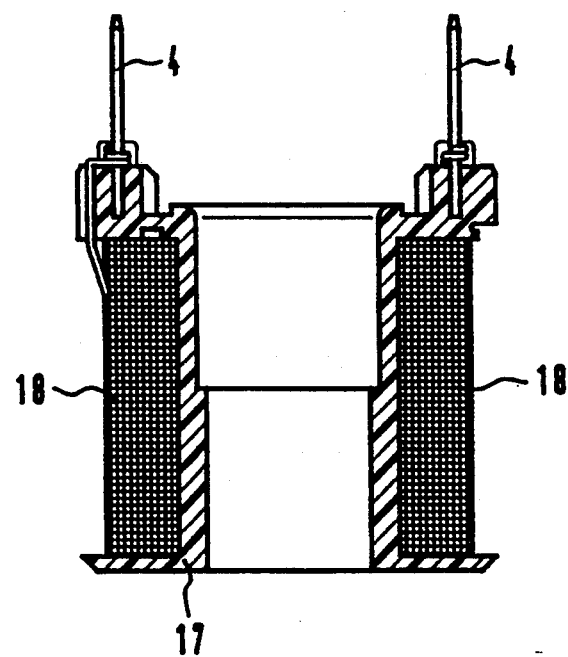

As is seen in FIG. 2, each valve coil 2 includes a metal yoke ring 19 and an annular coil body 17 of plastic, on which a winding 18 of an electromagnet for actuating the valve is applied. During installation, the yoke ring 19 is slipped over the wound coil body 17 and serves to carry the magnetic return flux of the coil. Each valve coil 2 has two of the connection wires 4, which are soldered to the ends of the winding 18.

The wound coil bodies 17 are inserted into the yoke ring 19 and held there by a press fit.

As compared to FIG. 1, the connection wires 4 of the valve coils 2 are bent as shown in FIG. 3 in such a way that they are disposed in one row once all of the valve coils 2 are installed in the housing frame 1. In the exemplary embodiment, eight of the valves coils 2 are accommodated in one housing frame 1, with each two valves coils 2 being next to one another, as is shown in FIG. 3. The section through the housing 1, 5 of the valve control unit also shows the configuration of the plug elements 10 and the prongs 14, by way of which the ABS control circuit can be connected to other control units in the motor vehicle or to the pump motor.

In order to install the valve control unit, the valve coils 2 with their components are placed in the housing frame 1, and all of these parts together are placed in an injection tool. In one operation, the components of the valve coils 2, and the valve coils 2 themselves, in the housing frame 1 are then elastically potted with the potting composition 3 by injection, as is seen in FIG. 4.

The valve coil 2 is filled in this process with the potting composition 3, so that all of the components of the valve coil 2 are fixed. Moreover, the valve coils in the housing frame 1 are positioned in their location with respect to the housing frame 1 by the potting composition 3. The components 17, 18, 19 of the valve coil 2 and the valve coils 2 are accordingly resiliently embedded in a single continuous potting composition 3, or in other words without joint areas or boundary layers in the potting composition.

In FIG. 4, one valve coil 2 is shown cut through its side at the coil 18, and a further one is shown cut through the center.

The potting composition 3 then surrounds the wound coil body 17. In the injection process, a dome-like recess 20 is left open, into which armatures of the valves that are to be moved electromechanically are later inserted. An upper portion of the valve coils 2 with their connection wires 4 is completely surrounded by the potting composition 3 and these coils are thus fixed in their location relative to the housing frame 1.

Moreover, when the lid 5 is closed, the potting composition 3 seals off the ABS control circuit of the valve control unit from the valve block and from the environment, thus protecting it against environmental factors.

Finally, when the valve control unit is installed it is mounted on the non-illustrated valve block, in which the actual valves are disposed. However, the mounting with the potting composition 3 is so resilient that production tolerances of the valve block are readily compensated for.

I claim:

1. A unit for controlling valves being actuated by electromagnets for a pressure fluid, comprising:
   a housing having a housing frame and a lid defining an interior;
   at least one valve coil and components of said at least one valve coil being disposed in said housing, said at least one valve coil being spaced from said housing frame defining interstices therebetween, and said components being mutually spaced apart defining interstices therebetween;
   a circuit carrier being disposed in the interior of said housing and being electrically connected to said at least one valve coil; and
   a resilient potting composition filling up the interstices between said components and between said at least one valve coil and said housing frame, without any boundary layers.

2. The unit according to claim 1, wherein said components of said at least one valve coil include a wound coil body and a yoke ring.

3. The unit according to claim 1, wherein said at least one valve coil is a plurality of valve coils being electrically connected to said circuit carrier and having interstices therebetween and interstices between said valve coils and said housing frame being filled up by said resilient potting composition.

4. The unit according to claim 1, wherein said potting composition fixes said at least one valve coil and said components in place relative to said housing frame.

5. A method for producing a unit for controlling valves being actuated by electromagnets for a pressure fluid including a housing having a housing frame and a lid defining an interior; at least one valve coil and components of the at least one valve coil being disposed in the housing, the at least one valve coil being spaced from the housing frame defining interstices therebetween, and the components being mutually spaced apart defining interstices therebetween; and a circuit carrier being disposed in the interior of the housing and being electrically connected to the at least one valve coil, which comprises:
   resiliently embedding the components and the at least one valve coil in the housing frame in one operation with a resilient potting composition filling up the interstices between the components and between the at least one valve coil and the housing frame, without any boundary layers.

6. The method according to claim 5, which comprises embedding a wound coil body and a yoke ring in the housing frame as the components of the at least one valve coil.

7. The method according to claim 5, which comprises electrically connecting a plurality of valve coils to the circuit carrier, and filling up interstices between the valve coils and interstices between the valve coils and the housing frame with the resilient potting composition.

8. The method according to claim 5, which comprises fixing the at least one valve coil and the components in place relative to the housing frame with the potting composition.

* * * * *